(12) United States Patent
Fan et al.

(10) Patent No.: US 7,991,172 B2
(45) Date of Patent: Aug. 2, 2011

(54) HALF-VOLTAGE HEADPHONE DRIVER CIRCUIT

(75) Inventors: Cheng-Hsuan Fan, Hsinchu (TW); Chao-Hsuan Chuang, Chupei (TW); Hung-Che Chou, Jiadong Township, Pingtung County (TW); Ching-Hsiang Yang, Taoyuan (TW); Shui-Mu Lin, Taichung (TW); Chih-Ping Tan, Hsinchu (TW)

(73) Assignee: Richtek Technology Corporation, Hsin-Chu (TW)

( * ) Notice: Subject to any disclaimer, the term of this patent is extended or adjusted under 35 U.S.C. 154(b) by 1097 days.

(21) Appl. No.: 11/755,894

(22) Filed: May 31, 2007

(65) Prior Publication Data
US 2008/0298605 A1    Dec. 4, 2008

(51) Int. Cl.
*H03F 99/00* (2009.01)
(52) U.S. Cl. ............................ 381/120; 381/74; 330/250
(58) Field of Classification Search .................... 381/74, 381/120, 323; 330/297, 310, 311, 250; 365/536, 365/226; 363/60; 307/110
See application file for complete search history.

(56) References Cited

U.S. PATENT DOCUMENTS

| 5,237,209 | A  | * | 8/1993 | Brewer ......................... 307/110 |
| 5,306,954 | A  | * | 4/1994 | Chan et al. .................... 307/110 |
| 6,411,531 | B1 | * | 6/2002 | Nork et al. ....................... 363/60 |
| 6,922,097 | B2 | * | 7/2005 | Chan et al. .................... 327/536 |
| 2003/0179892 | A1 | * | 9/2003 | Madsen ........................ 381/120 |
| 2005/0110574 | A1 | * | 5/2005 | Richard et al. ................ 330/297 |

OTHER PUBLICATIONS

Maxim, Dubler/Inverter Carge Pumps Divide by Two, Application Note 1876, Feb. 3, 2003.*
Maxim, MAX1730, "50mA Regulated Step-Down Charge Pump for 1.8 or 1.9 Logic", Feb. 28, 2000.*

* cited by examiner

*Primary Examiner* — Vivian Chin
*Assistant Examiner* — Friedrich W Fahnert
(74) *Attorney, Agent, or Firm* — Tung & Associates

(57) ABSTRACT

The present invention discloses a half-voltage headphone driver circuit, comprising: at least one operational amplifier providing an output to a headphone speaker, and a charge pump receiving a supply voltage (VDD), generating a positive half-voltage and a negative half-voltage (VDD/2 and –VDD/2) based on the supply voltage, and supplying the positive half-voltage and negative half-voltage as high and low operation levels to the at least one operational amplifier.

4 Claims, 5 Drawing Sheets

HALF-VOLTAGE HEADPHONE DRIVER CIRCUIT

FIELD OF INVENTION

The present invention relates to a half-voltage headphone driver circuit which makes it feasible to use devices of lower ratings, with lower power consumption, and lower cost.

BACKGROUND OF THE INVENTION

FIG. 1 shows a typical structure of a conventional two-channel headphone driver circuit. In order to obtain a maximum dynamic range, the output of such conventional headphone is biased at a nominal DC voltage, which typically is half of a supply voltage VDD (as an example, VDD=5V and VDD/2=2.5V in the shown figure). However, the DC bias causes significant amount of current to flow into the headphone speaker 16 and 18; this may, in addition to unnecessary power consumption, cause the headphone and the headphone driver to be damaged. Hence, the circuit requires capacitors Cdec to isolate the DC bias, and the capacitance of the capacitor Cdec is considerably large (in the range of several hundred µF).

The output waveform of this conventional headphone is shown in FIG. 2, in which the peak amplitude is VDD, the valley is 0, and the average is VDD/2.

In view of the problems caused by the DC bias, an improvement as shown in FIG. 3 is proposed, in which the low operation level of the two operational amplifiers is set to −VDD, so that the DC bias of the output voltage becomes 0. This eliminates the requirement of the large capacitors, but the circuit requires two operation voltages VDD and −VDD, and it is undesired to provide an additional I/O port for an external input of −VDD. Thus, this prior art proposes a charge pump 10, which converts the supply voltage VDD to −VDD, so that the circuit only requires one voltage supply. The output waveform of this conventional headphone is shown in FIG. 4, in which the peak amplitude is VDD, the valley is −VDD, and the average is 0.

The second headphone driver circuit described above has the drawbacks that, the amplitude becomes double, so that the devices need to sustain higher voltage; and the power consumption also becomes double. Thus, it is desired to provide a headphone driver circuit that does not require large capacitors, consumes less power than the above-mentioned prior art, and does not require devices with a higher voltage rating.

SUMMARY OF THE INVENTION

In view of the foregoing, it is an objective of the present invention to provide an improved circuit to overcome the drawbacks in the prior art.

In accordance with the foregoing and other objectives of the present invention, the present invention discloses a half-voltage headphone driver circuit, comprising: at least one operational amplifier providing an output to a headphone speaker, and a charge pump receiving a supply voltage (VDD), generating a positive half-voltage and a negative half-voltage (VDD/2 and −VDD/2) based on the supply voltage, and supplying the positive half-voltage and negative half-voltage as high and low operation levels to the at least one operational amplifier.

Preferably, the charge pump includes a capacitor circuit operative in a first mode in which the capacitor circuit is charged by the supply voltage, and a second mode in which the capacitor circuit generates the positive half-voltage and the negative half-voltage. Preferably, the charge pump includes synchronous switches, and the charge pump switches between the first and second modes according to the operation of the synchronous switches.

It is to be understood that both the foregoing general description and the following detailed description are provided as examples, for illustration rather than limiting the scope of the invention.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENT

Figure 1:
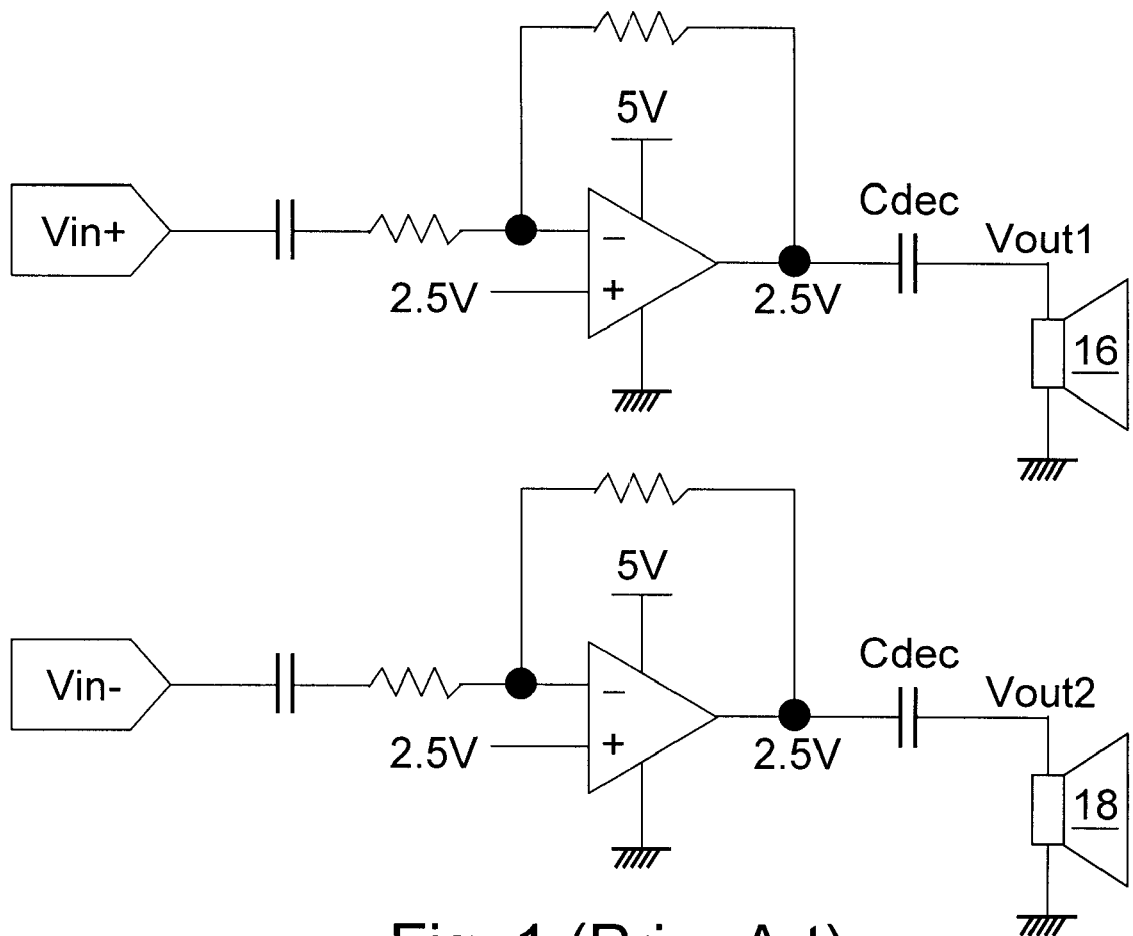
FIG. 1 is a schematic diagram showing a typical structure of a conventional two-channel headphone driver circuit.
Figure 2:
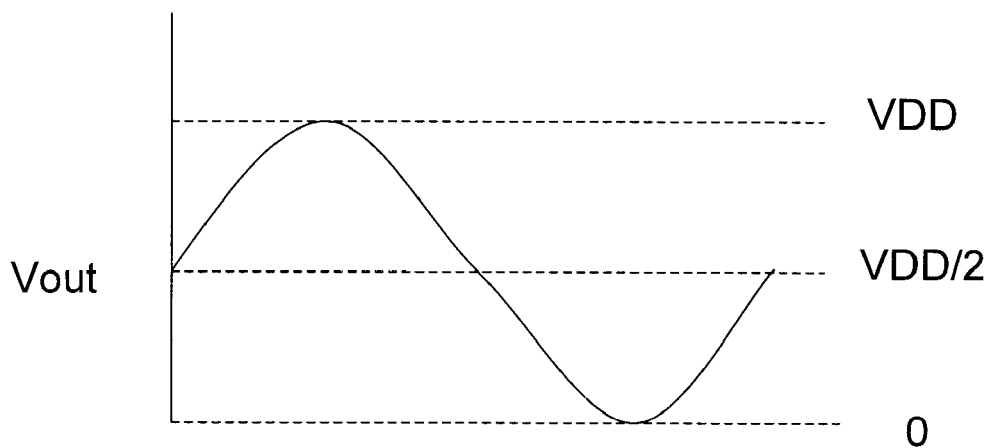
FIG. 2 is a corresponding waveform according to the circuit of FIG. 1.
Figure 3:
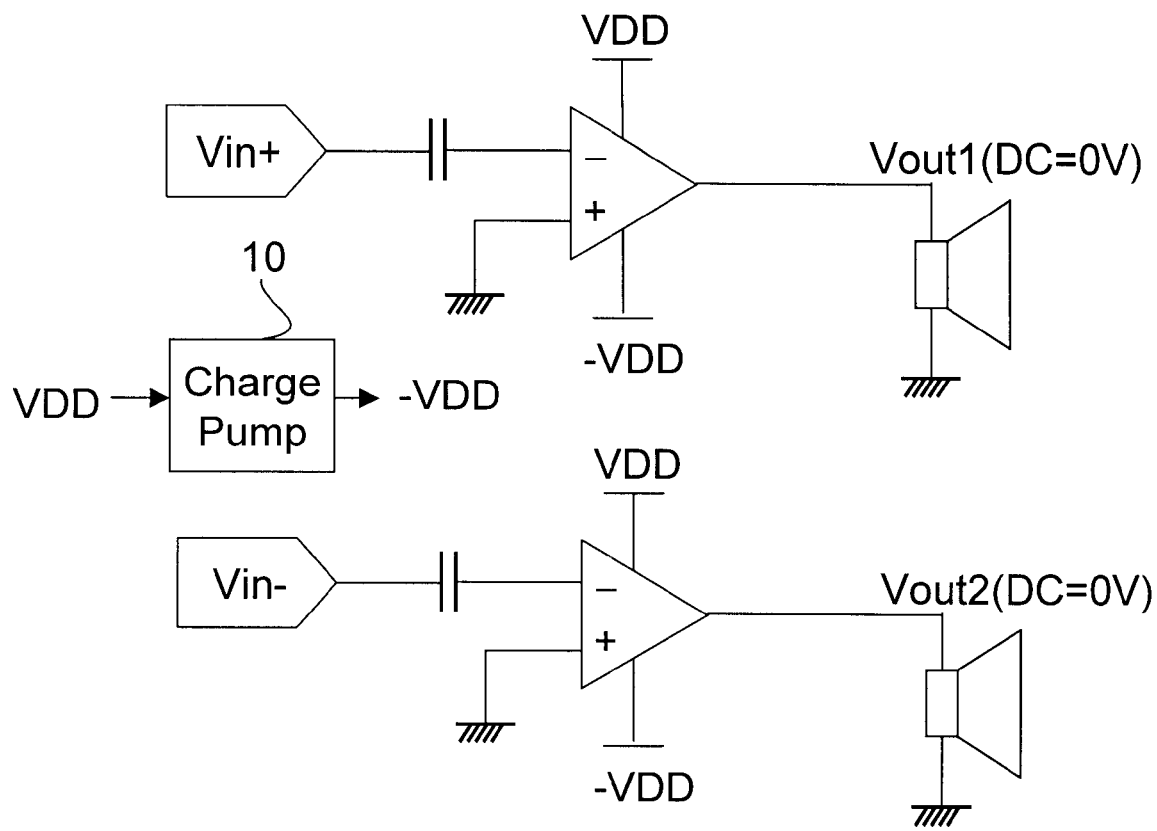
FIG. 3 is schematic diagram showing another conventional two-channel headphone driver circuit.
Figure 4:
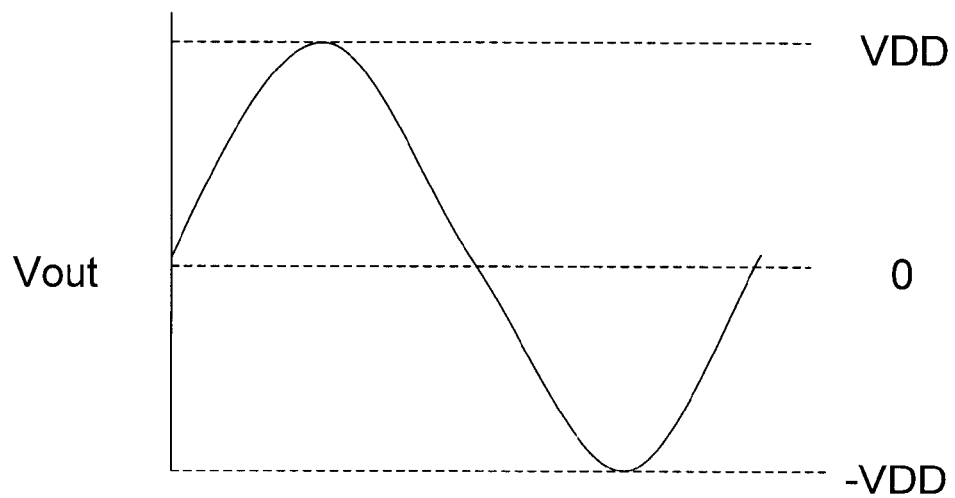
FIG. 4 is a corresponding waveform according to the circuit of FIG. 3.
Figure 5:
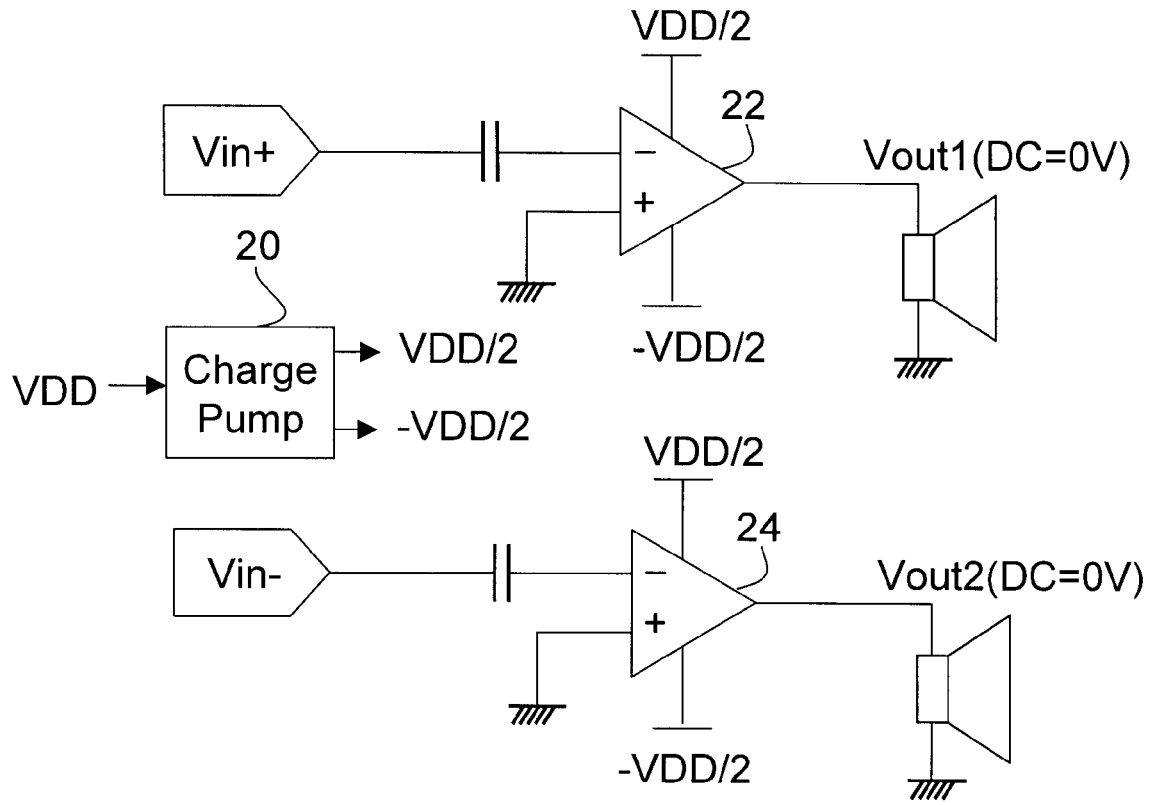
FIG. 5 is schematic diagram showing a preferred embodiment of a two-channel headphone driver circuit of the present invention.
Figure 6:
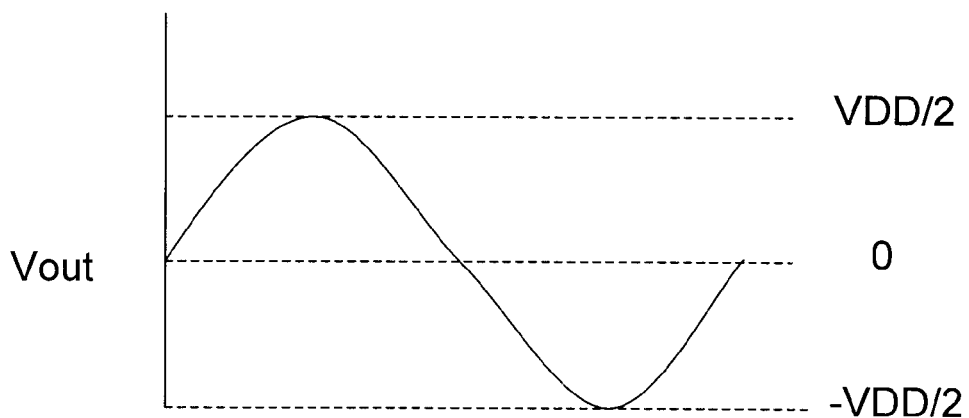
FIG. 6 is a corresponding waveform according to the circuit of FIG. 5.

Referring to FIG. 5, the spirit of the present invention is to operate the two operational amplifiers 22 and 24 between a high operation level of VDD/2 and a low operation level of −VDD/2, so that the DC bias of the output voltage is still 0, but the amplitude of the output voltage becomes VDD instead of 2*VDD, as shown in FIG. 6.

Figure 7:
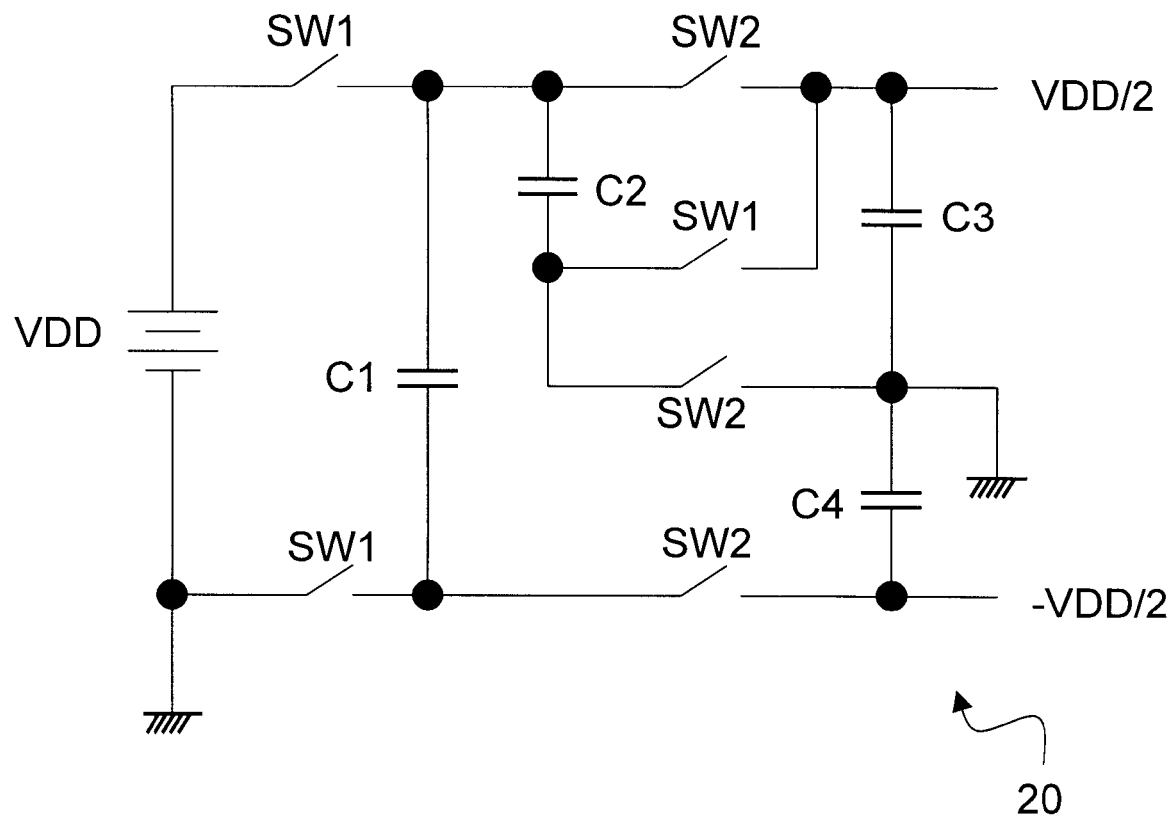
FIG. 7 shows, by example, an embodiment of the charge pump 20 according to the present invention.
Figure 7:
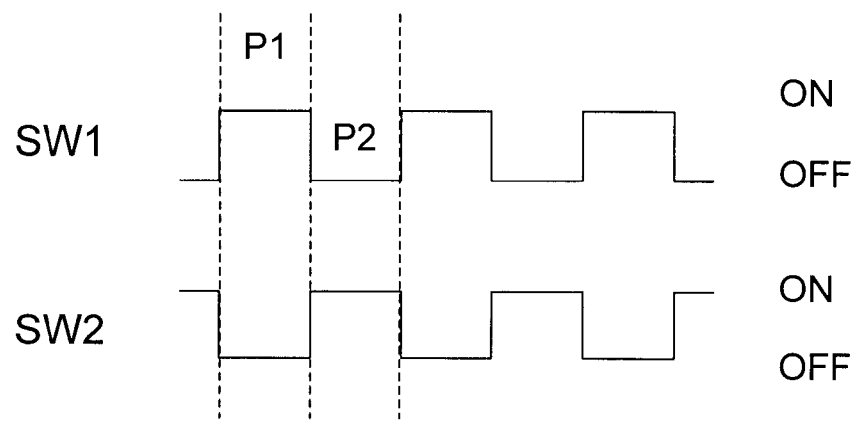

To this end, the circuit needs to operate in three operation voltages VDD, VDD/2, and −VDD/2, that is, the present invention needs to generate the positive half-voltage VDD/2 and the negative half-voltage −VDD/2 from a single supply voltage VDD, as shown by the charge pump 20 in the figure. As an example, an embodiment of the charge pump 20 according to the present invention is shown in FIG. 7. It should be noted that one skilled in this art can readily conceive other forms of the charge pump 20 under the teaching by the present invention, which should fall in the scope of the present invention.

Figure 8:
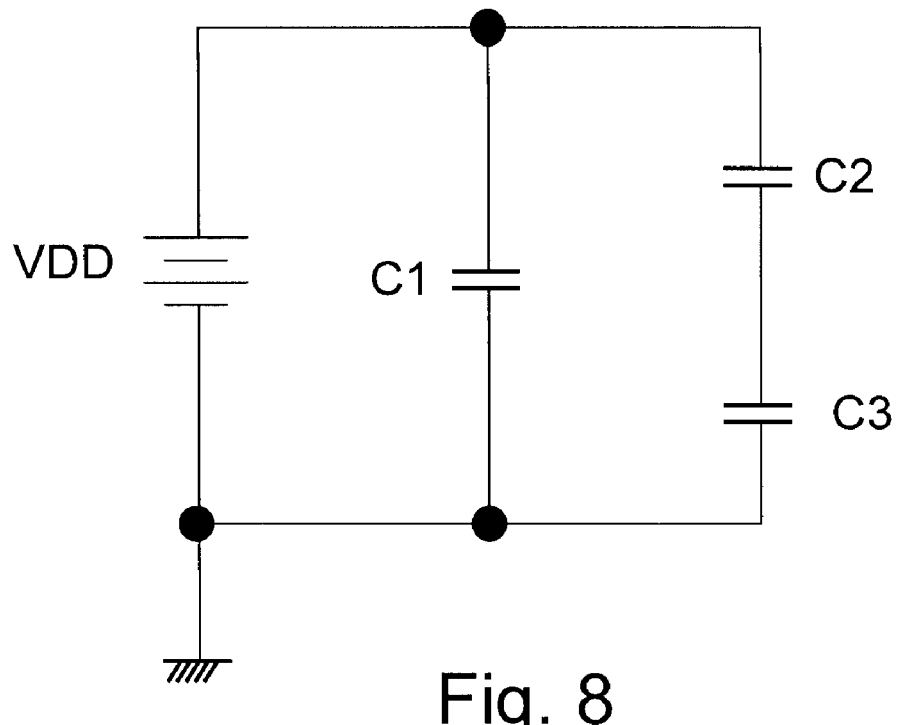
FIGS. 8 and 9 respectively show equivalent circuits of the charge pump 20 in different modes.
Figure 9:
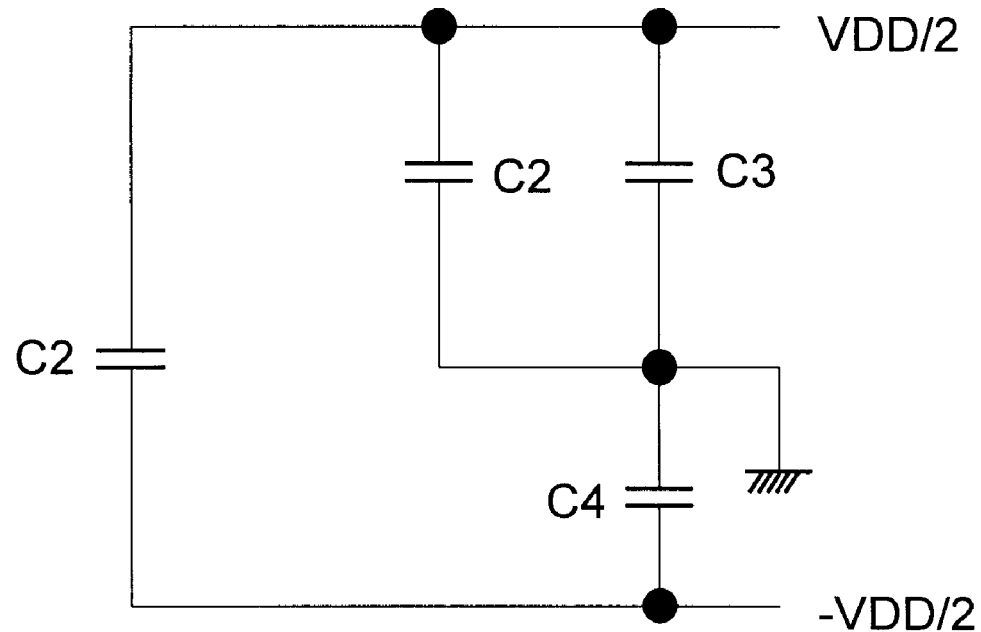

In the charge pump 20 shown in FIG. 7, all the switches SW1 operate synchronously, and all the switches SW2 also operate synchronously. As shown in the lower part of the figure, in phase P1, all the switches SW1 are ON and the switches SW2 are OFF, and the opposite in phase P2. In other words, in phase P1, the circuit shown in FIG. 7 is equivalent to the circuit shown in FIG. 8, wherein the supply voltage VDD charges the capacitors C1, C2 and C3. In phase P2, the circuit shown in FIG. 7 is equivalent to the circuit shown in FIG. 9, wherein the circuit generates the positive half-voltage VDD/2 and the negative half-voltage −VDD/2, by proper arrangement of the capacitances of the capacitors C1-C4.

It should be noted that the waveform in the lower part of FIG. 7 is for illustration of the operation of the switches; it does not imply that the switches SW1 and SW2 have to be NMOS devices.

Although the present invention has been described in detail with reference to certain preferred embodiment thereof, it is for illustrative purpose rather than for limiting the scope of the present invention. Other variations and modifications may be readily conceived by one skilled in this art in light of the teaching of the present invention. For example, the application of the present invention is not limited to two-channel headphone. As another example, there are other ways to generate the positive half-voltage VDD/2 and the negative half-voltage −VDD/2. In view of the foregoing, it is intended that the present invention cover all such modifications and variations, which should be interpreted to fall within the scope of the following claims and their equivalents.

What is claimed is:

1. A half-voltage headphone driver circuit, comprising:
   at least one operational amplifier providing an output to a headphone speaker, and
   a charge pump receiving a supply voltage (VDD), generating a positive half-voltage and a negative half-voltage (VDD/2 and −VDD/2) based on the supply voltage, and supplying the positive half-voltage and negative half-voltage as high and low operation levels to the at least one operational amplifier,
   wherein the charge pump includes a capacitor circuit operative in a first mode in which the capacitor circuit is charged by the supply voltage, and a second mode in which the capacitor circuit generates the positive half-voltage and the negative half-voltage.

2. The half-voltage headphone driver circuit of claim 1, comprising two operational amplifiers providing outputs to two headphone speakers respectively.

3. The half-voltage headphone driver circuit of claim 1, wherein in the first mode, the capacitor circuit includes a first capacitor electrically connected in parallel with the supply voltage, and a second and a third capacitors which are electrically connected in series with each other and which are electrically connected in parallel with the supply voltage, and wherein in the second mode, the capacitor circuit is not connected with the supply voltage, and the capacitor circuit includes the first capacitor and a capacitor sub-circuit electrically connected in parallel with the first capacitor, the capacitor sub-circuit including the third and a fourth capacitors which are electrically connected in series with each other, and the second capacitor which is electrically connected in parallel with the third capacitor.

4. The half-voltage headphone driver circuit of claim 1, wherein the charge pump includes synchronous switches, and the charge pump switches between the first and second modes according to the operation of the synchronous switches.

* * * * *